United States Patent [19]
Krivokapic

[11] Patent Number: 6,100,159
[45] Date of Patent: Aug. 8, 2000

[54] QUASI SOI DEVICE

[75] Inventor: Zoran Krivokapic, Santa Clara, Calif.

[73] Assignee: Advanced Micro Devices, Inc., Sunnyvale, Calif.

[21] Appl. No.: 08/965,339

[22] Filed: Nov. 6, 1997

[51] Int. Cl.$^7$ .......................... H01L 21/76; H01L 21/336
[52] U.S. Cl. ......................... 438/413; 438/424; 438/296
[58] Field of Search .................................. 438/413, 296, 438/424, 479, 291

[56] References Cited

U.S. PATENT DOCUMENTS

| | | | |
|---|---|---|---|
| 5,554,256 | 9/1996 | Pruijmboom et al. | 438/296 |
| 5,899,732 | 5/1999 | Gardner | 438/473 |

*Primary Examiner*—John F. Niebling
*Assistant Examiner*—Walter L Lindsay, Jr.
*Attorney, Agent, or Firm*—LaRiviere, Grubman & Payne, LLP

[57] ABSTRACT

The present invention provides a fabrication process for fabricating a semiconductor integrated circuit device on a silicon substrate having an active device region isolated from the underlying substrate similar to a silicon on insulator(soi) substrate structure. The quasi-soi structure provides an inexpensive semiconductor integrated circuit device having a reduced floating body effect. The process for fabricating the substrate for use in fabricating the quasi-soi semiconductor device includes the steps of providing a silicon substrate member, fabricating at least one passivation layer consisting of silicon nitride over the silicon substrate member and protecting an underlying substrate surface region for subsequent fabrication of isolation trench regions, fabricating the isolation trench regions by etching portions of the passivation layer and portions of the substrate surface region forming an epitaxial silicon growing region. The process further includes the steps of fabricating the epitaxial silicon layer on the epitaxial silicon growing region and over the oxide isolation trenches, fabricating an MOS gate structure region including a silicon dioxide layer grown over the epitaxial silicon layer, and a polysilicon layer deposited over said silicon dioxide layer. The MOS gate structure is further surrounded by a spacer region under which is formed the devices channel region and salicidated source and drain regions for the quasi-soi semiconductor device. The source and drain regions are an implanted dopant material extending from the channel region to form an electrical path to a respective one of said isolation trench regions forming a capacitance junction.

8 Claims, 6 Drawing Sheets

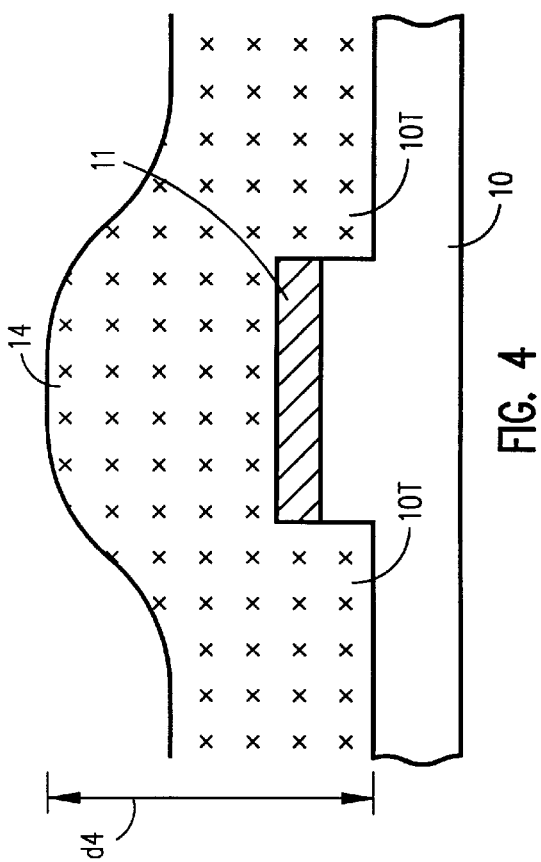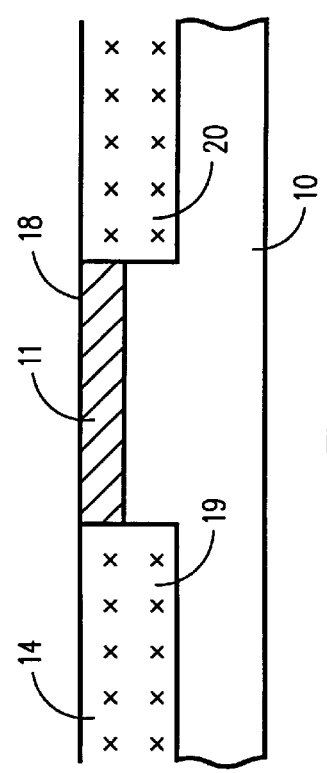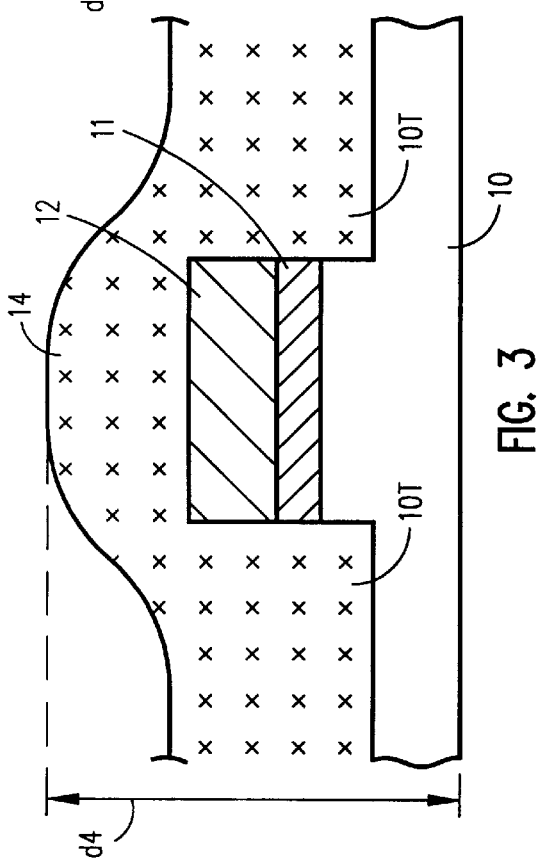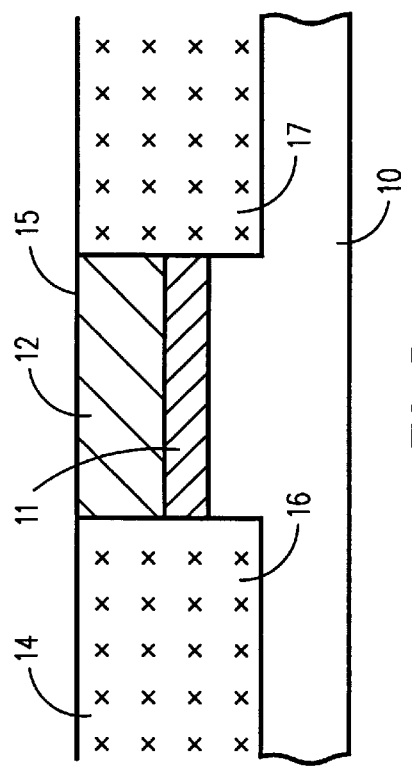

QUASI SOI DEVICE

TECHNICAL FIELD

The present invention relates to integrated circuits and fabrication techniques for fabricating semiconductor substrate structures having silicon on insulator (SOI) electrical properties. More particularly, the present invention relates to integrated circuits and fabrication techniques for fabricating semiconductor substrate structures having silicon on insulator (SOI) electrical properties and which reduce the floating body effect caused by the complete electrical isolation characteristic of the active area in a SOI substrate structure.

BACKGROUND OF THE INVENTION

The trend in microelectronic circuitry is to implement new circuitry which will increase the performance speed, have higher density and provide increased functions with maximum reliability. MOS and CMOS devices have been used to implement circuitry which continually meet the industry demands. MOS and CMOS devices, which comprise a semiconducting substrate under the active area, have undergone structural improvements that electrically isolate the active area of the MOS and CMOS device in order to extend the performance limits of these devices, by example for improving parameters such as the junction capacitance. The term used in the semiconductor industry to describe an isolated active semiconductor structure is silicon on insulator, abbreviated as SOI. Since the active region of the SOI device is electrically isolated, the active region of the device is said to be floating. The floating characteristic, or floating body effect, results in instability of the voltage potential of the device and in a small drain-to-source breakdown voltage. Devices to reduce the floating body effect have been proposed. Noteworthy is a structure proposed in an article entitled "Body-Contacted SOI MOSFET Structure with Fully Bulk CMOS Compatible Layout and Process" by Yo-Hwan Koh, et al., IEEE Electron Device Letters, Vol. 18, No. 3, March 1997. While the Koh, et al. proposed device suppresses the floating body effect, a need is still seen to exist for a semiconductor device that not only has the benefits of an SOI device and that minimizes the floating body effect, but is not burdened by the cost of the SOI substrate, such as the commercially available SIMOX wafers utilized in the Koh, et al. proposed device.

Thus, a primary object of the present invention is to provide a semiconductor integrated circuit device fabricated on a substrate having an active device region isolated from the underlying substrate similar to a silicon on insulator (SOI) substrate structure.

A related object of the present invention is to provide an inexpensive semiconductor integrated circuit device fabricated on a substrate having an active device region isolated from the underlying substrate similar to a silicon on insulator(SOI) substrate structure and also having a reduced floating body effect.

BRIEF SUMMARY OF THE INVENTION

Accordingly, the foregoing objects are accomplished by providing an integrated circuit substrate device formed by fabricating a semiconductor integrated circuit device on a silicon substrate having an active device region isolated from the underlying substrate similar to a silicon on insulator(soi) substrate structure. The quasi-soi structure provides an inexpensive semiconductor integrated circuit device having a reduced floating body effect. The process for fabricating the substrate for use in fabricating the quasi-soi semiconductor device includes the steps of providing a silicon substrate member, fabricating at least one passivation layer consisting of silicon nitride over the silicon substrate member and protecting an underlying substrate surface region for subsequent fabrication of isolation trench regions. Fabricating the isolation trench regions by etching portions of the passivation layer and portions of the substrate surface region to form an epitaxial silicon growing region. The process further includes the steps of fabricating the epitaxial silicon layer on the epitaxial silicon growing region and over the oxide isolation trenches, fabricating an MOS gate structure region including a silicon dioxide layer grown over the epitaxial silicon layer, and a polysilicon layer deposited over the silicon dioxide layer. The MOS gate structure is further surrounded by a spacer region under which is formed the devices channel region and salicidated source and drain regions for the quasi-soi semiconductor device. The source and drain regions are an implanted dopant material extending from the channel region to form an electrical path to a respective one of said isolation trench regions forming a capacitance junction.

Other features of the present invention are disclosed or apparent in the section entitled: "DETAILED DESCRIPTION OF THE INVENTION".

BRIEF DESCRIPTION OF DRAWINGS

For fuller understanding of the present invention, reference is made to the accompanying drawing in the following Detailed Description of the Invention. In the drawings:

FIG. 3 shows the masked dual passivation layer region depicted in FIG. 2 being TEOS treated in preparation for producing a first embodiment of the present invention.

FIG. 4 shows the masked dual layer region depicted in FIG. 2 after removing the photoresist mask and one of passivations layer being TEOS treated in preparation for producing a second embodiment of the present invention.

FIG. 5 shows the semiconductor substrate depicted in FIG. 3 after having the TEOS polished substantially flush with the upper passivation layer.

FIG. 6 shows the semiconductor substrate depicted in FIG. 4 after having the TEOS polished substantially flush with the single passivation layer.

Figure 1:
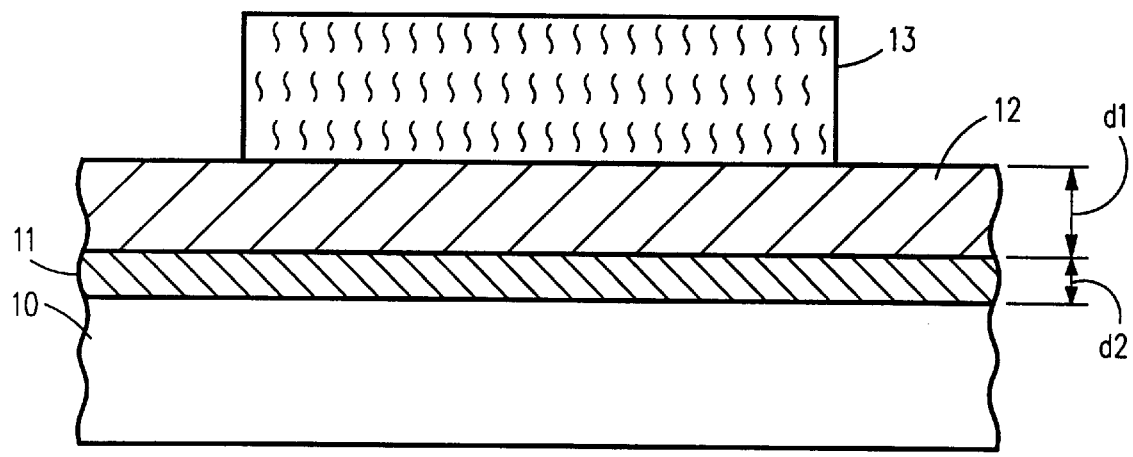
FIG. 1 is a cross-section of a semiconductor substrate shown having a plurality of passivation layers masked in preparation for being fabricated in accordance with the present inventions.

Reference numbers refer to the same or equivalent parts of the present invention throughout the several figures of the drawing.

DETAILED DESCRIPTION OF THE INVENTION

Figure 2:
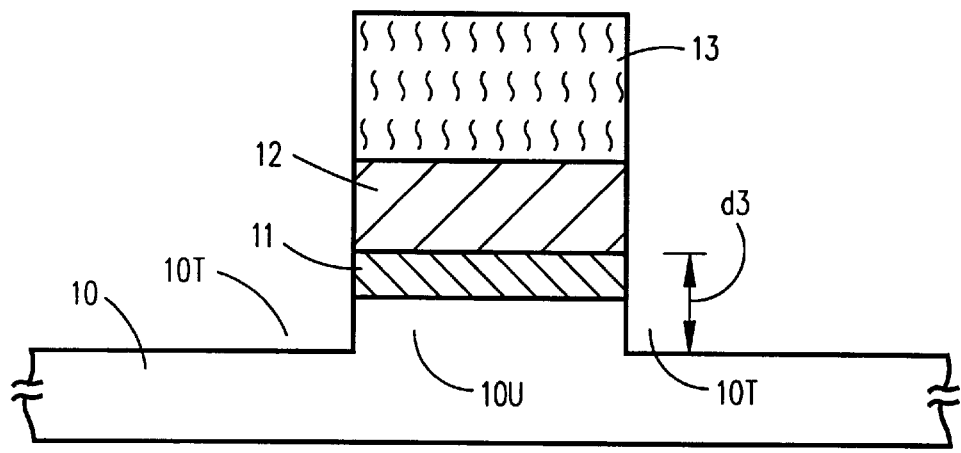
FIG. 2 is a masked region of a semiconductor substrate depicted in FIG. 1 which remains after a photolithographic process.

FIGS. 1–6 comprise trench isolation fabrication steps for use in fabrication of the quasi-SOI device of the present invention. By example, FIG. 1 shows a cross-section of a semiconductor substrate 10 having passivation layers 11 and 12 masked with a photoresist mask layer 13 in preparation for being fabricated in accordance with the present inventions. Substrate 10 is preferably a silicon semiconductor substrate material having layer 11 formed from silicon dioxide thermally grown to a thickness d2 in the range of 5 nm. to 10 nm. By example, layer 11 may be formed by placing substrate 10 in an oxygen-containing atmosphere and heating the substrate to a temperature in the range of 750° C. to 850° C. for approximately five minutes. For purposes associated with providing higher dielectric protection of the underlying substrate surface region, layer 12 is formed over the silicon dioxide by depositing silicon nitride to a thickness d1 in the range of 0.05 $\mu$m. to 0.10 $\mu$m. The silicon nitride is preferably deposited using low-pressure chemical vapor deposition (LPCVD) techniques. Photoresist mask layer 13 is deposited over silicon nitride layer 12 and comprises any appropriate commercially available photoresist material known in the industry. Photoresist mask layer 13 is then patterned for forming isolation trenches 10T in substrate 10. FIG. 2 shows semiconductor substrate 10, fabricated as depicted in FIG. 1, and having a portion of photoresist layer patterned for protecting appropriate portions of layers 11, 12 and an upper surface portion 10U of substrate 10. Upon etching, isolation trench regions 10T are formed adjacent the stack pattern comprising the substrate region 10U, silicon oxide layer 11, silicon nitride layer 12 and a portion of photoresist layer 13. In order to form trench regions 10T, the upper surface of substrate 10 is etched an amount d3, comprising approximately 0.25 $\mu$m. Photoresist layer portion 13 is subsequently removed for further fabrication. It is worthwhile to note that,while FIG. 1 shows a substrate 10 with silicon dioxide layer 11 and silicon nitride layer 12 formed as passivation layers, the silicon nitride layer 12 may optionally be omitted. FIGS. 3 and 4 depict pre-trench fabrication illustrations of substrate 10 with both silicon dioxide layer 11 and silicon nitride layer 12 (FIG. 3), and with only a silicon dioxide layer 11 (FIG. 4), respectively. Both FIGS. 3 and 4 illustrate formation of trench isolation regions 10T by formation of an oxide layer 14 over the patterned stack (layers 11,12 FIG. 3), or (layer 11 FIG. 4). Oxide layer 14 is preferably deposited thicker over the region directly above stack layers 11 and 12 and is preferably formed as a silicon dioxide layer using tetraethylorthosilicate (TEOS) as the source for deposition of silicon dioxide. The thickness d4 of layer 14 in the region directly above stack layers (11,12), or layer 11 is preferably in the range of 1.2 $\mu$m to 1.5 $\mu$m. FIGS. 5 and 6 show substrate 10, in alternate fabrication states, each having the TEOS layer 14 with trench isolation regions 10T polished to a surface level 15, or 18, to produce completed isolation trenches (16,17), or (19, 20), to a thickness substantially even with silicon nitride level 12 in FIG. 5, or with silicon dioxide layer 11 in FIG. 6. Subsequent to formation of isolation trenches (16,17), or (19, 20), layers (11,12), and layer 11 are removed. Layers 11, 12, comprising silicon nitride and silicon dioxide, are removed by wet etching substrate 10 using hot phosphoric acid to first etch silicon nitride layer 12, then by dipping substrate 10 in a hydrofluoric acid (HF) dip to etch the silicon dioxide layer 11. In the case where only layer 11 has been formed, substrate 10 is dipped in hydrofluoric acid to etch silicon dioxide layer 11.

Figure 7:
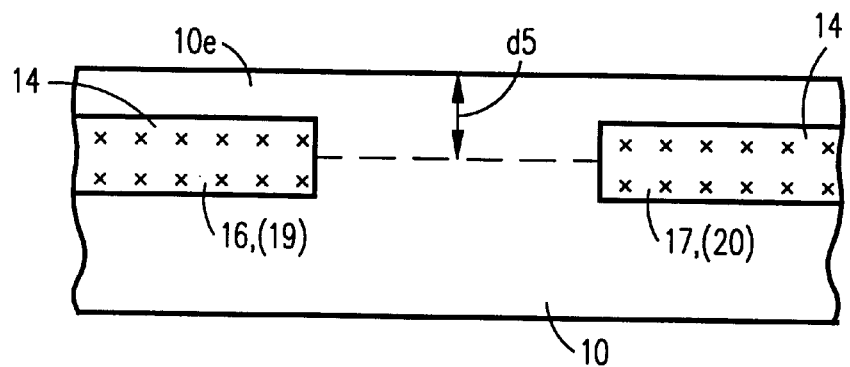
FIG. 7 is a cross-section of a semiconductor substrate produced by either process step depicted in FIGS. 5 or 6, and produced after removal of the passivation layers, showing an epitaxial layer fabricated over the TEOS and the region previously occupied by the passivation layers.
Figure 8:
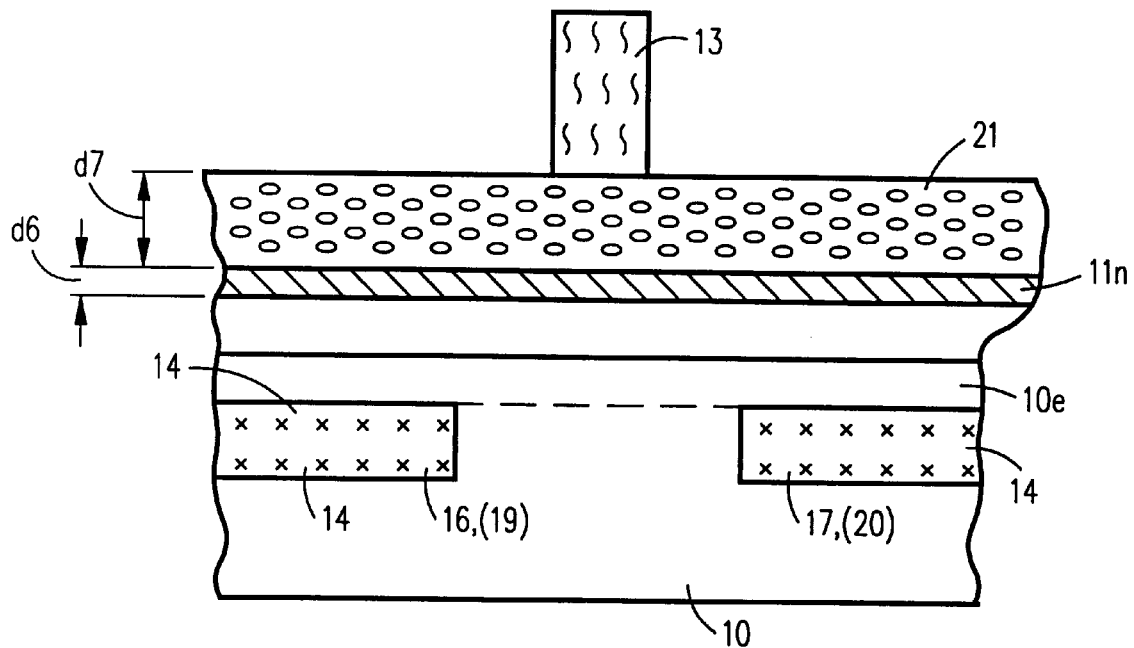
FIG. 8 is a cross-section of a semiconductor substrate after being processed in accordance with the process step depicted in FIG. 7, shown having a passivation layer and a poly-semiconductor layer fabricated over the epitaxial layer and having a gate region masked for further fabrication in accordance with the present invention.
Figure 9:
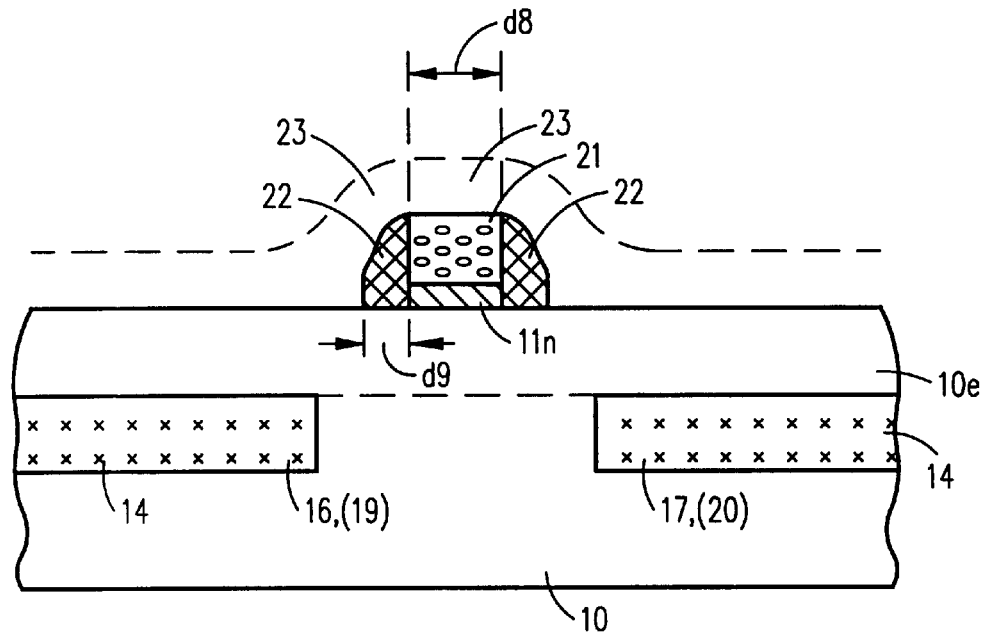
FIG. 9 is a cross-section of a semiconductor substrate fabricated as depicted in FIG. 8 having a gate region produced after etching the passivation layer and the poly-semiconductor layer and showing a spacer portion fabricated about the gate region.

After formation of isolation trenches (16,17), or (19,20), which may comprise several similarly fabricated isolation trench areas on substrate 10, a selective epitaxy process is undergone to produce epitaxial silicon layer 10e, as shown in FIG. 7. During this epitaxy process, epitaxial layer 10e is fabricated over oxide isolation trenches (16,17), or (19, 20), and the portion of exposed silicon material of substrate 10 resulting after removal of layers 11, 12. Epitaxial layer 10e is grown to a thickness d5 in the range of 0.1 $\mu$m. to 0.15 $\mu$m. FIG. 8 shows substrate 10, subsequent to the selective epitaxy process, where a new silicon dioxide layer 11n is grown over epitaxial layer 10e to a thickness d6 in the range of 1.5 nm. to 3.0 nm. FIG. 8 also shows polysilicon layer 21 deposited over oxide layer 11n to a thickness d7 in the range of 0.12 $\mu$m. to 0.20 $\mu$m. FIG. 8 further shows a photoresist portion 13 deposited over a polysilicon region which will be used for fabricating a MOS device in accordance with the present invention. FIG. 9 shows a gate stack, comprising gate oxide 11n and polysilicon 21 after etching unprotected layer portions of those materials shown in FIG. 8. The unprotected portions of polysilicon layer 21 and gate oxide layer 11n may be plasma etched using a plasma reactor, followed by a short hydrofluoric acid dip. The protected stack comprising the polysilicon 21 and gate oxide 11n portions are etched to a width d8 in the range of 10 nm to 12 nm. After removal of the photoresist, an oxide layer 23, shown in broken lines, is deposited on the polysilicon 21 and thin gate oxide 11n stack using a low-pressure CAD (LPCVD) process. The LPCVD process depositing the oxide layer 23 is followed by an anisotropic plasma etch to form spacer regions 22 about the polysilicon 21 and gate oxide 11n stack. The spacers 22 are formed to a width d9 in the range of 2 nm to 4 nm.

Figure 10:
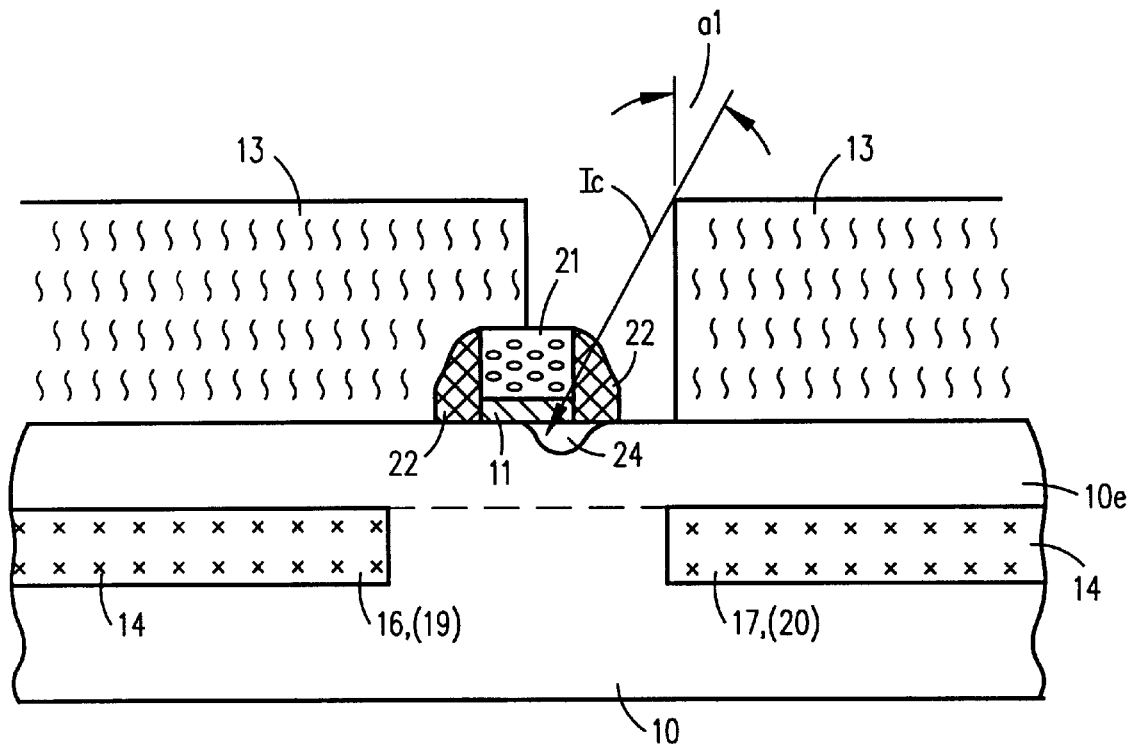
FIG. 10 is a cross-section of a semiconductor MOS device fabricated as depicted in FIG. 9 shown having a masked placed about the source region leaving the drain region exposed for facilitating high concentration tilt-ion implantation of the drain region.
Figure 11:
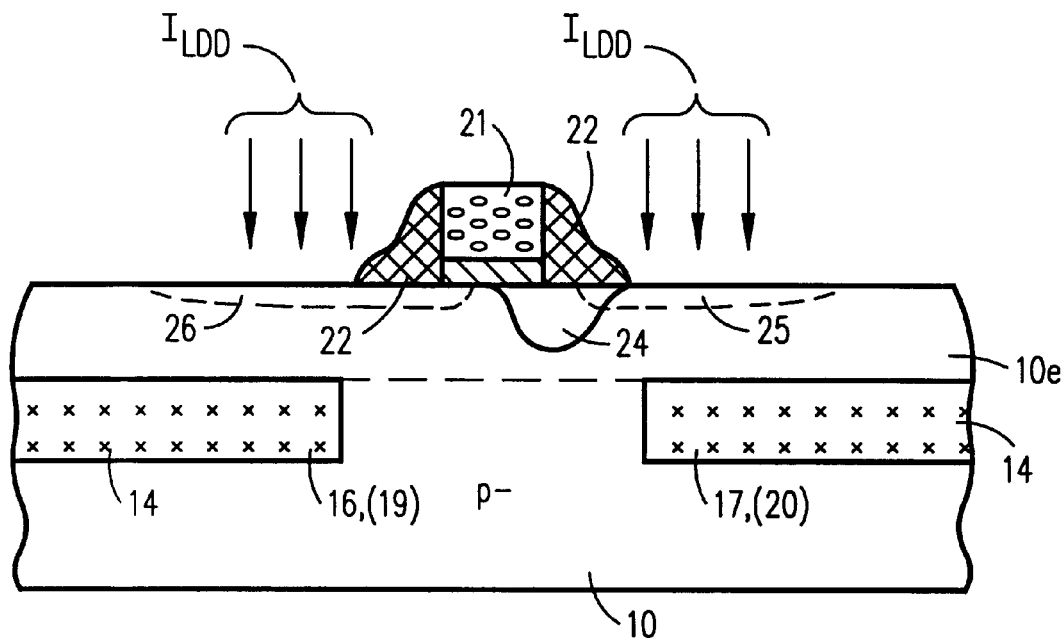
FIG. 11 is a cross-section of a semiconductor MOS device fabricated as depicted in FIG. 10 shown having the source and drain regions formed by a lightly doped drain (LDD), orthogonally-directed, ion implantation process step about the gate region.
Figure 12:
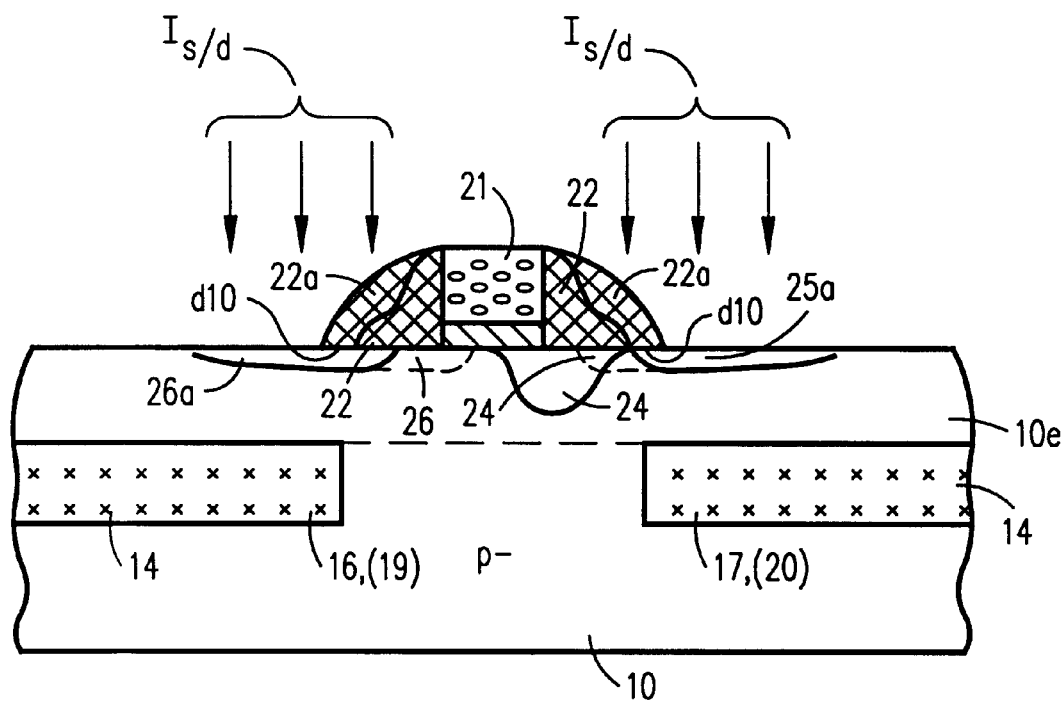
FIG. 12 is a cross-section of a semiconductor MOS device fabricated as depicted in FIG. 11 shown further being processed to produce a larger spacer region and having the source and drain regions further being doped by an orthogonally-directed, ion implantation process step about the spacer protected gate region.
Figure 13:
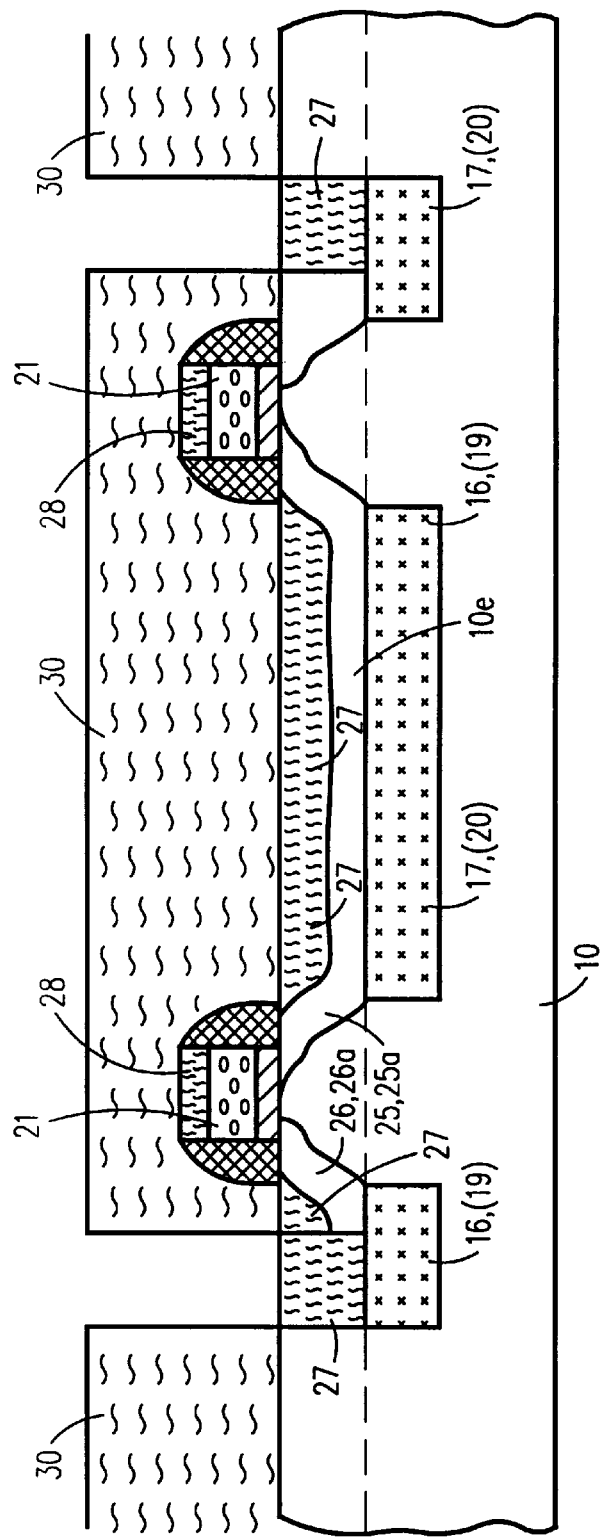
FIG. 13 is a cross-section of a larger portion of a semiconductor device fabricated as depicted in FIG. 12 shown having a silicide layer over the poly-semiconductor gate, source and drain regions and between gate structures, and masked for subsequent etching of the silicide and silicon over the trench regions.

Subsequent to the formation of the spacer/polysilicon gate structure illustrated in FIG. 9, a series of channel implant steps for an MOS transistor structure are undertaken. FIG. 10 shows a first layer of photoresist material 13 deposited over substrate 10 such that a source region, located below the left side of spacer 22 and left side of gate oxide 11n, is protected. A second layer of the photoresist material 13 is deposited beyond the polysilicon/spacer stack 21,22 leaving a gap for facilitating tilt implantation of boron for forming a channel region of the MOS transistor structure. FIG. 10 shows channel implantation process Ic being performed at an angle a1 directed to the unprotected portions of the polysilicon/spacer stack 21,22. Angled implant Ic comprises, by example, implant of boron ions at an energy of 30–90 KeV, at an angle a1, in the range of 7 to 40 degrees, to define a concentration of boron ranging from $1.0 \times 10^{13}$ to $1.5 \times 10^{13}$ atm/cm² in a region 24 of epitaxial layer portion 10e. After implant, the photoresist is removed by plasma etching, by example using $O_2$ plasma etching. Subsequently, channel implant 24 undergoes a rapid thermal anneal (RTA) process for 30 minutes at 900° C. in a nitrogen $N_2$ ambient. FIG. 11 shows a second ion implantation process $I_{LDD}$ for forming a drain region 25 using lightly doped drain LDD implanting techniques. Implant $I_{LDD}$ comprises, by example, implant of arsenic (As) ions at an energy of 5–10 KeV, at a 0° angle (perpendicular to the surface of epitaxial layer 10e), to define a concentration of arsenic ranging from $5.0 \times 10^{18}$ to $1.0 \times 10^{19}$ cm⁻³ in drain region 25, as well as on source region 26 of epitaxial layer portion 10e. For reference purposes, substrate 10 may comprise P-type silicon lightly doped, designated as P-in FIG. 11, and having a dopant concentration of $1 \times 10^{18}$ cm⁻³. To complete formation of the source 26 and drain 25 regions, spacer region 22 is extended during a third ion implantation step. FIG. 12 shows spacer region 22a fabricated about spacers 22, and source/drain implantation $I_{s/d}$ process being directed normal to epitaxial surface 10e. Spacer region 22a may be fabricated similarly to spacer 22, by example, a LPCVD process depositing an oxide layer followed by an anisotropic plasma etch to form additional spacer region 22a. The additional spacer region 22a is formed to a width d10 in the range of 2 nm to 3 nm. Implant $I_{s/d}$ comprises, by example, implanting arsenic (As) ions at an energy of 1.5–5 KeV, at a 0° angle (perpendicular to the surface of epitaxial layer 10e), to define additional concentration of arsenic ranging from $1.0 \times 10^{20}$ to $1.5 \times 10^{20}$ cm⁻³ in drain region 25a, as well as on source region 26a of epitaxial layer portion 10e. The $I_{s/d}$ implant step is followed by a rapid thermal anneal (RTA) process for 30 to 60 minutes at 900° C. to 1000° C. in a nitrogen $N_2$ ambient. After the RTA process, the MOS structure undergoes a salicidation process comprising silicide formation of a refractory metal such as titanium Ti on the surface of epitaxial silicon layer 10e, or on the polysilicon layer 21. FIG. 13 shows a cross-section of a larger portion of a semiconductor substrate 10 fabricated as depicted in FIG. 12. FIG. 13, in particular, shows silicide regions 27 formed over epitaxial layer 10e between two similarly formed polysilicon MOS gate structures, as well as over the drain 25, 25a and source 26, 26a regions. A silicide region 28 is also formed over the polysilicon stack layers 21, mask 30 is provided for subsequent etching of the silicide 27 over isolations trenches 16, (19), 17, (20), as shown in FIG. 13.

The present invention has been particularly shown and described with respect to a certain preferred embodiment and features thereof. However, it should be readily apparent to those of ordinary skill in the art that various changes and modifications in form, semiconductor material, material conductivity type i.e. N-type, or P-type, and detail may be made without departing from the spirit and scope of the inventions as set forth in the appended claims. The inventions illustratively disclosed herein may be practiced without any element which is not specifically disclosed herein.

What is claimed is:

1. A method for fabricating a silicon substrate for use in fabricating a quasi-soi semiconductor device, said method comprising the steps of:

(a) providing a silicon substrate member;

(b) fabricating at least one passivation layer consisting of silicon nitride over said silicon substrate member and protecting an underlying substrate surface region for facilitating subsequent fabrication of at least one pair of isolation trenchs;

(c) fabricating at least one pair of isolation trench regions by etching portions of said at least one passivation layer and portions of said substrate surface region and forming said at least one pair of isolation trenches, said formed at least one pair of isolation trenches defining an epitaxial silicon growing region;

(d) fabricating an epitaxial silicon layer over said epitaxial silicon growing region;

(e) fabricating an MOS gate structure region for said quasi-soi semiconductor device, said MOS gate structure region comprising a silicon dioxide layer grown over said epitaxial silicon layer and a polysilicon layer deposited over said silicon dioxide layer;

(f) fabricating a spacer region around said MOS gate structure region, said spacer region being formed by a low-pressure CAD (LPCVD) process depositing a silicon dioxide layer and performing an anisotropic plasma etching step;

(g) fabricating a channel region beneath said silicon dioxide layer recited in step (e) and said spacer region, said channel region being formed by an angled implant process for implanting a dopant material;

(h) fabricating a salicidated source region for said quasi-soi semiconductor device adjacent said channel region; and (i) fabricating a salicidated drain region for said quasi-soi semiconductor device on said epitaxial layer at an opposing end of said source region, said source and drain regions comprising implant dopant material extending from said channel region to form an electrical path to a respective one of said isolation trench regions.

2. A method for fabricating a silicon substrate as described in claim 1, wherein:

said step (g) comprises implanting said dopant material as an angled implant of boron ions at an energy of 30–90 KeV, at an angle ranging from 7 to 40 degrees and forming a concentration of boron ranging from $1.0 \times 10^{13}$ to $1.5 \times 10^{13}$ atm/cm².

3. A method for fabricating a silicon substrate as described in claim 1, wherein:

said steps (h) and (i) for fabricating said source and drain regions comprises implanting arsenic ions at an energy of 1.5–5 KeV, at an angle perpendicular to a surface of said epitaxial silicon layer, and forming a concentration of arsenic ranging from $1.0 \times 10^{20}$ to $1.5 \times 10^{20}$ cm⁻³, and being electrically coupled to a respective one of said isolation trench regions forming a capacitance junction.

4. A method for fabricating a silicon substrate as described in claim 3, wherein:

said steps (h) and (i) for fabricating said source and drain regions further comprises forming a titanium salicide layer over said implant of arsenic.

5. A method for fabricating a silicon substrate as described in claim 1, wherein:

said step (d) for fabricating said epitaxial silicon layer grown over said isolation trench regions comprises a further step of removing the epitaxial silicon layer and replacing with a trench salicide layer.

6. A method for fabricating a silicon substrate as described in claim 5, wherein:
   said step of replacing said epitaxial silicon layer comprises forming said trench salicide layer as a titanium salicide layer.

7. A method for fabricating a silicon substrate as described in claim 1, wherein:
   said step (f) for fabricating said spacer region comprises etching said silicon dioxide and forming said spacer region adjacent said polysilicon-oxide MOS gate structure member and having a width in the range of 4 nm to 7 nm.

8. A method for fabricating a silicon substrate for use in fabricating a quasi-soi semiconductor device, said method comprising the steps of:
   (a) providing a silicon substrate member;
   (b) fabricating at least one passivation layer consisting of silicon nitride over said silicon substrate member and protecting an underlying substrate surface region for facilitating subsequent fabrication of at least one pair of isolation trenches;
   (c) fabricating at least one pair of isolation trench regions by etching portions of said at least one passivation layer and portions of said substrate surface region and forming said at least one pair of isolation trenches, said formed at least one pair of isolation trenches defining an epitaxial silicon growing region;
   (d) etching portion of said at least one passivation layer remaining between said formed at least one pair of isolation trenches and further defining said epitaxial silicon growing region;
   (e) fabricating an epitaxial silicon layer over said further defined epitaxial silicon growing region;
   (f) forming a polysilicon-oxide MOS gate structure over said epitaxial silicon layer, said polysilicon-oxide MOS gate structure being surrounded by an oxide spacer and having a gate salicide layer grown over a polysilicon layer portion of said MOS gate structure;
   (g) forming a channel region beneath said MOS gate structure member, said channel region being a dopant material implanted within said epitaxial silicon layer;
   (h) forming a salicidated source region on said epitaxial silicon layer adjacent said channel region; and
   (i) forming a salicidated drain region on said epitaxial silicon layer at an opposing end of said source region, said source and drain regions comprising implant dopant material extending from said channel region to form a junction at a corresponding one of said at least one pair of isolation trenches, each said junction forming respective capacitance junctions.

* * * * *